United States Patent
Yang et al.

(10) Patent No.: US 11,344,910 B2
(45) Date of Patent: May 31, 2022

(54) SPIN DISPENSER MODULE SUBSTRATE SURFACE PROTECTION SYSTEM

(71) Applicant: Taiwan Semiconductor Manufacturing Company, Ltd., Hsinchu (TW)

(72) Inventors: Ching-Hai Yang, Taipei (TW); Yao-Hwan Kao, Baoshan Shiang (TW); Shang-Sheng Li, Zhubei (TW); Kuo-Pin Chen, Zhubei (TW); Hsiang-Kai Tseng, Zhunan Township (TW); Chuan-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 343 days.

(21) Appl. No.: 15/858,797

(22) Filed: Dec. 29, 2017

(65) Prior Publication Data
US 2018/0117621 A1  May 3, 2018

Related U.S. Application Data

(62) Division of application No. 14/179,337, filed on Feb. 12, 2014, now Pat. No. 9,855,579.

(51) Int. Cl.
| | |
|---|---|
| *B05D 1/00* | (2006.01) |
| *B05C 11/10* | (2006.01) |
| *B05C 11/08* | (2006.01) |
| *B05B 11/00* | (2006.01) |
| *G03F 7/16* | (2006.01) |

(Continued)

(52) U.S. Cl.
CPC ...... *B05C 11/1039* (2013.01); *B05B 11/3097* (2013.01); *B05C 11/08* (2013.01); *G03F 7/162* (2013.01); *G03F 7/3021* (2013.01); *H01L 21/6715* (2013.01); *B05D 1/005* (2013.01)

(58) Field of Classification Search
CPC ..... B05D 1/005; B05C 11/08; B05C 11/1039; B05B 11/3097; G03F 7/162; G03F 7/3021; H01L 21/6715
USPC .......................................... 427/240; 430/434
See application file for complete search history.

(56) References Cited

U.S. PATENT DOCUMENTS

| | | | |
|---|---|---|---|
| 3,900,866 A * | 8/1975 | Bell ................... | G01D 15/06 346/140.1 |
| 5,871,584 A | 2/1999 | Tateyama et al. | |
| 5,939,139 A * | 8/1999 | Fujimoto ............... | B05D 1/005 427/240 |

(Continued)

*Primary Examiner* — Brian K Talbot
(74) *Attorney, Agent, or Firm* — Slater Matsil, LLP

(57) ABSTRACT

A spin dispenser module and methods for using the same is disclosed. The spin dispenser module includes a cup having a basin with sidewalls and an exhaust, a rotatable platform situated inside the cup adapted for holding and rotating a substrate, a liquid dispenser disposed over the rotatable platform for dispensing a liquid coating material on top of the substrate, one or more ejector inlets disposed over the rotatable platform, the one or more ejectors connected to a negative pressure source, and a motor coupled to the rotatable platform to rate the rotatable platform at different rotational speeds. The one or more ejector inlets may be translatable and/or rotatable with optionally adjustable suction pressure. The ejector inlets operate after a liquid coating material is dispensed to avoid deposition of suspended organic compounds after a coating is formed.

20 Claims, 5 Drawing Sheets

(51) Int. Cl.
  *G03F 7/30* (2006.01)
  *H01L 21/67* (2006.01)

(56) References Cited

U.S. PATENT DOCUMENTS

| | | | | |
|---|---|---|---|---|
| 5,952,050 A * | 9/1999 | Doan | ............ | B05D 1/005 |
| | | | | 118/52 |
| 6,092,937 A * | 7/2000 | Snodgrass | ............ | G03D 5/04 |
| | | | | 134/902 |
| 6,709,699 B2 * | 3/2004 | Ema | ............ | B05D 3/0254 |
| | | | | 118/320 |
| 8,287,647 B2 * | 10/2012 | Yoon | ............ | H01L 21/28562 |
| | | | | 118/719 |
| 2002/0121341 A1 * | 9/2002 | Tanaka | ............ | H01L 21/67051 |
| | | | | 156/345.21 |
| 2003/0198468 A1 * | 10/2003 | Park | ............ | G03F 7/3092 |
| | | | | 396/564 |
| 2004/0115567 A1 * | 6/2004 | Mandal | ............ | H01L 21/6715 |
| | | | | 430/324 |
| 2005/0147748 A1 * | 7/2005 | Nguyen | ............ | G03F 7/162 |
| | | | | 427/230 |
| 2005/0285104 A1 * | 12/2005 | Jeong | ............ | B08B 5/04 |
| | | | | 257/48 |
| 2010/0112225 A1 * | 5/2010 | Sato | ............ | B05D 3/105 |
| | | | | 427/335 |
| 2011/0073035 A1 * | 3/2011 | Horikawa | ............ | B05C 5/0254 |
| | | | | 118/300 |
| 2012/0052190 A1 * | 3/2012 | Sasagawa | ............ | H01L 21/6715 |
| | | | | 427/58 |
| 2014/0045344 A1 * | 2/2014 | Terao | ............ | H01L 21/02282 |
| | | | | 438/782 |
| 2015/0224532 A1 | 8/2015 | Yang et al. | | |

\* cited by examiner

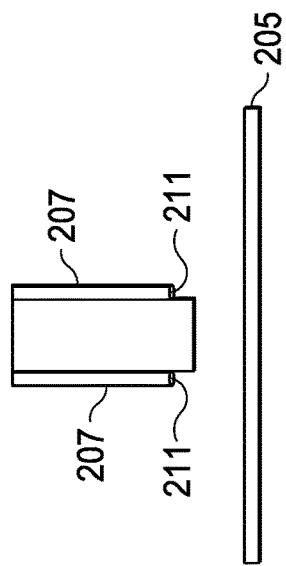
FIG. 3A
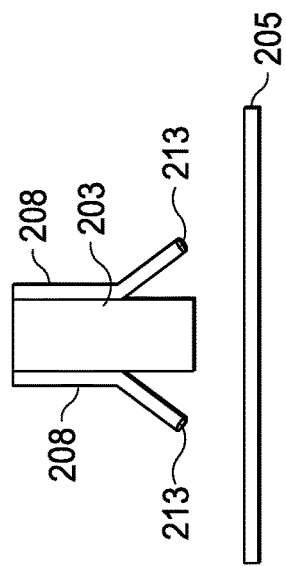
FIG. 3B
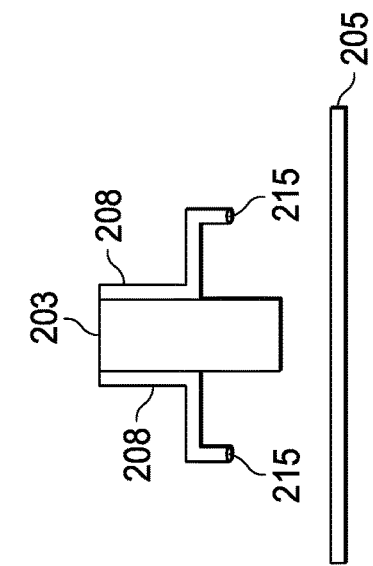
FIG. 3C
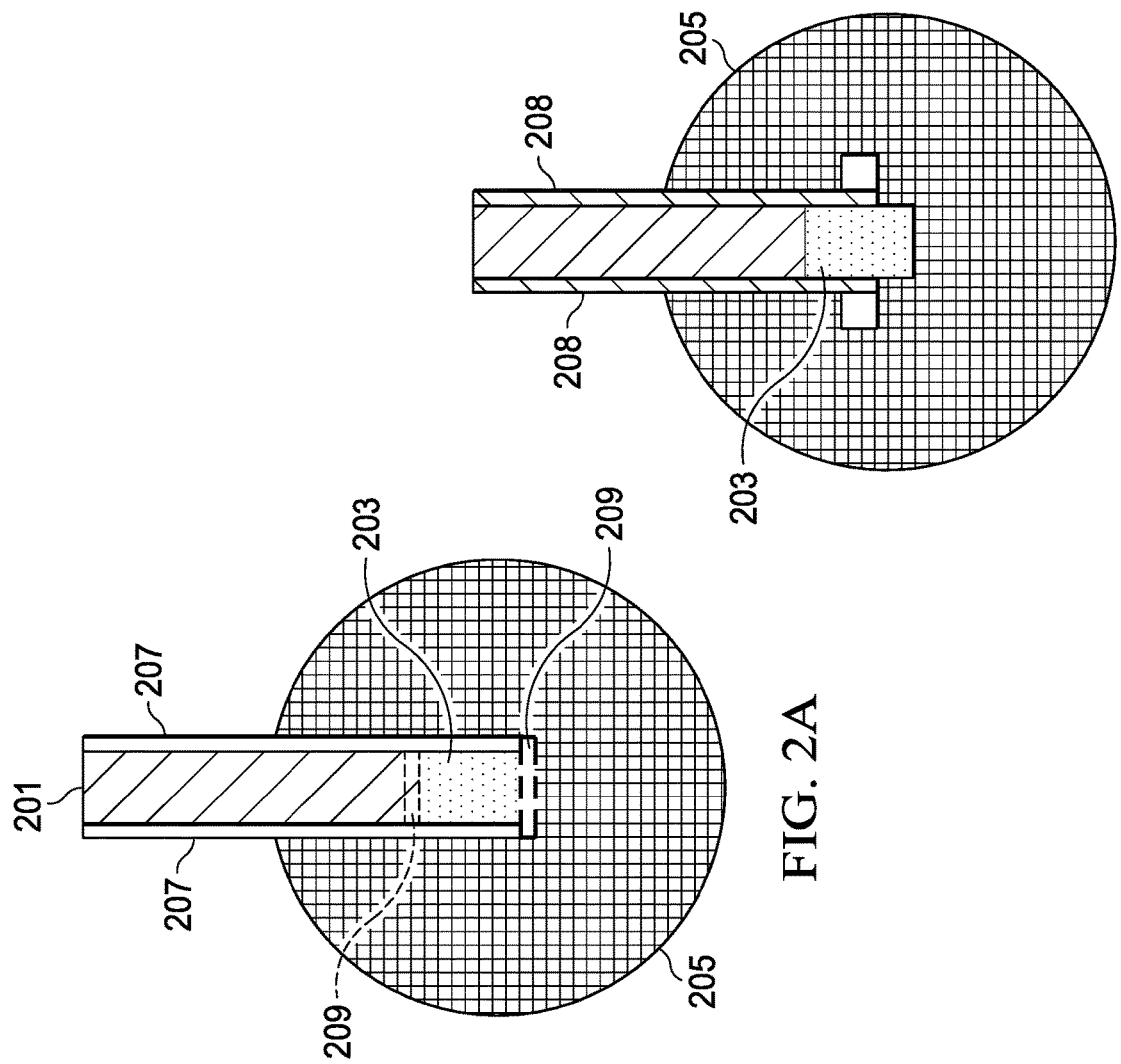
FIG. 2A
FIG. 2B

SPIN DISPENSER MODULE SUBSTRATE SURFACE PROTECTION SYSTEM

PRIORITY CLAIM AND CROSS-REFERENCE

This application is a division of and claims priority to U.S. patent application Ser. No. 14/179,337, filed Feb. 12, 2014, which application is herein incorporated by reference.

BACKGROUND

The present invention relates generally to a spin module system, and more particularly, to a method and apparatus for preventing the deposition and accumulation of organic compounds on a substrate surface after forming a coating.

In manufacturing integrated circuits, a lithography process is used for reproducing layers to form structures on a semiconductor substrate. As a first step in a lithography process, a photoresist layer is coated onto a semiconductor substrate such that an image can be projected and developed thereon. The photoresist material is a liquid that is coated in a very thin layer on top of the substrate. In a conventional process for applying a photoresist coating material to a substrate, a spin dispenser module is normally used. The liquid coating material is dispensed over the substrate and the substrate spun so that a uniform coating remains on the substrate. One or more materials may be so dispensed and coat the substrate. The backside of the substrate is rinsed and the coating material removed from an edge of the substrate. The coating is allowed to dry before it is soft-baked to solidify.

An image pattern is then projected onto the photoresist material. In the developing process, a spin dispenser module is also used. The developer solution dissolves or chemically changes either the exposed portion or unexposed portion of the photoresist material. The developer solution is dispensed over the substrate in a scan pattern while the substrate spins. Once the chemical reaction takes place, the substrate is rinsed to remove a portion of the photoresist material. The resulting coat pattern is baked to harden and may be used as a mask for an etch step or a deposition step to form a subsequent layer on the substrate. As the feature sizes decrease for integrated circuits, the quality of the coating and developing becomes more important. Defects may form by deposition of unwanted material during and after the coating and developing processes. Therefore, improved method and apparatus continues to be sought.

BRIEF DESCRIPTION OF THE DRAWINGS

The features, aspects, and advantages of the present invention will become more fully apparent from the following detailed description, appended claims, and accompanying drawings in which:

FIGS. 2A and 2B are top views of dispenser arm and dispenser over a substrate according to various aspects of the present invention.

FIGS. 3A to 3C are cross-sectional views of a dispenser and ejector over a substrate in accordance with various embodiments of the present disclosure.

DETAILED DESCRIPTION

In the following description, numerous specific details are set forth to provide a thorough understanding of the present invention. However, one having an ordinary skill in the art will recognize that the invention can be practiced without these specific details. Reference will now be made in detail to the present preferred embodiments of the present invention, examples of which are illustrated in the accompanying drawings.

Figure 1:
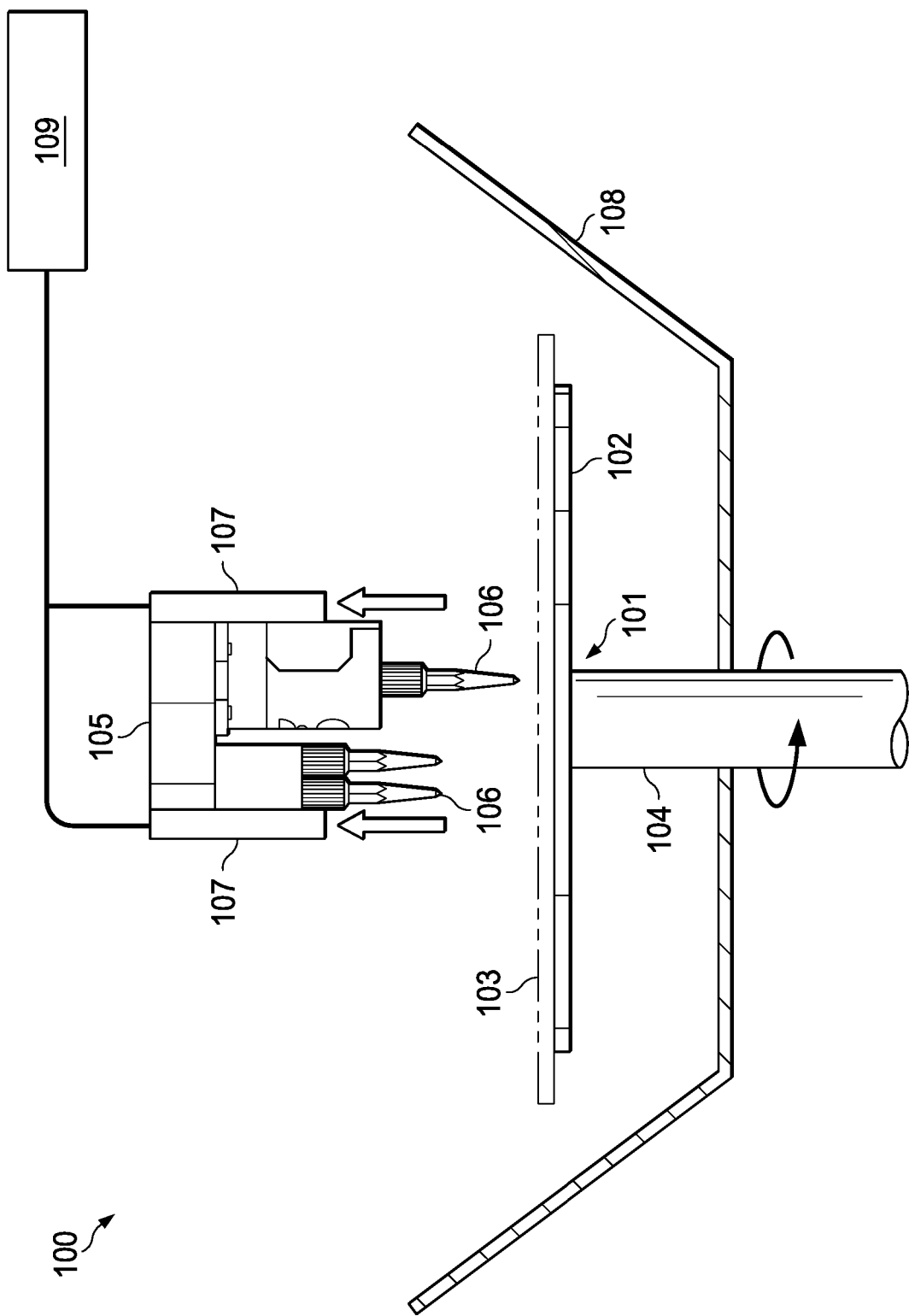
FIG. 1 is a cross-sectional view of a spin dispenser module in accordance with various embodiments of the present disclosure.

FIG. 1 is a schematic of a spin dispenser module 100 in accordance with various embodiments of the present disclosure. The spin dispenser module includes a circular-shaped, rotatable platform 101 that has a diameter smaller than the diameter of a semiconductor substrate 103. The rotatable platform 101 is positioned in a cup 108 and includes a vacuum chuck 102—vacuum is applied to the platform to hold the semiconductor substrate securely during a spin process. The rotatable platform is positioned in the spin dispenser module 100 such that a semiconductor substrate 103 may be placed on top horizontally. During the coating process, the bottom or uncoated surface of a substrate 103 contacts the vacuum chuck 102. A suitable vacuum is applied to the bottom surface of the substrate 103 such that it stays securely on the vacuum chuck 102 at high rotational speeds. The rotating motion of the vacuum chuck 102 is achieved by a shaft 104, which is connected to the vacuum chuck 102 and powered by a motor. The motor is capable of rotating the vacuum chuck at different speeds. The cup 108 includes one or more exhausts to which excess liquid coating material flows. The spin dispenser module 100 also includes a liquid dispenser 105 disposed over the rotatable platform 101. The liquid dispenser 105 is connected to a liquid coating material source that supplies a chemical, which may be a photoresist material, a developer, or some other chemical to be dispensed onto and coat a substrate. The liquid dispenser 105 includes one or more nozzles 106 through which the liquid coating material flows. One or more ejector inlets 107 is also disposed over the substrate and connected to a negative pressure source 109. The ejector inlets 107 are configured to remove gaseous and solid particles from the volume over the substrate 103.

In some embodiments, the negative pressure source 109 is a Venturi pump. A Venturi pump is formed by reducing a flow area of a high pressure gas flow, for example, facilities air, that creates a suction pressure at the area of flow reduction. When the ejector inlets 107 are connected to the reduced flow area, a suction is created at the ejector inlets 107. The exhaust from the Venturi pump includes the flow gas and any material from the ejector inlets 107. In one example, the exhaust is routed to a facility's chemical exhaust that is further treated. In some embodiments, the negative pressure source 109 is a vacuum pump. Vacuum pumps are used with the spin dispenser module may also be connected to the ejector inlets 107 as the negative pressure source 109.

The amount of suction power applied by the ejector inlets is configured to not affect the coated film properties or to create a pattern. For example, the suction power should not be so excessive as to prematurely dry a photoresist coating or developer solution. The suction power should not create a pattern on the coating and negatively affect the coating uniformity. On the other hand, the suction power should be sufficiently strong to remove suspended particles in the chamber volume over the substrate so as to prevent unwanted deposition on the substrate. The suction power and the distance of the ejector inlet from a substrate surface are designed to maximize removal without adversely affecting the coating. In some examples, a negative pressure of 5 kPa to 50 kPa, for example, about 20 kPa is applied.

One use of a spin dispenser module is to coat a photoresist material on a substrate. In a photoresist coating process in accordance with various embodiments of the present disclosure, a desirable amount of a liquid photoresist material is applied to a top surface of the substrate from the liquid dispenser as the substrate spins. The photoresist liquid spreads radially outward from a location of the semiconductor substrate where the liquid is applied towards the edge of the substrate until the entire top surface of the substrate is covered with a thin layer. Excess photoresist liquid spins off the rotating substrate during the photoresist coating process. The rotational speed of the vacuum chuck and the amount of the photoresist liquid applied can be determined and adjusted prior to and during an application process such that a predetermined, desirable thickness of the photoresist is obtained. Once a thickness profile is established, the ejector inlets start to remove any gaseous or particle organic material suspended in the volume over the substrate. The ejector inlets provide a suction to the volume over the substrate by a negative pressure relative to the chamber volume. The ejector inlets may work concurrently with a backside rinsing and/or an edge bevel removal operation where excess photoresist is removed from the substrate from the backside and from an edge of the substrate. The substrate is dried and removed from the spin dispenser module. According to various embodiments, the ejector inlets remain active after the drying even if the substrate is not removed immediately from the spin dispenser module to avoid unwanted deposition of organic material.

Another use of a spin dispenser module is to develop exposed photo resist material on a substrate. After the photoresist layer is formed, the substrate is exposed to a patterned light that affects the chemical properties of the photoresist. When a positive photoresist is used, a portion of the photoresist that is exposed to light becomes soluble to a photoresist developer. When a negative photoresist is used, a portion of the photoresist that is not exposed to light becomes soluble to a photoresist developer. The spin dispenser module may be used to apply the developer to the substrate. A dispenser arm is mounted on a track while the substrate is rotated at a dispensing speed on the vacuum chuck. The dispenser nozzle may scan the substrate to ensure even distribution of the developer. The developer and the photoresist is given time to react and then a dissolved portion of the photoresist layer is removed by rinsing. The substrate is then dried. The ejector inlets remove gaseous or particle organic material suspended in the volume over the substrate during the rinsing and drying operations and may also be used during the dispensing operation. The rotational speed of the vacuum chuck varies during this process during dispensing, one or more rinsing steps, and drying. According to various embodiments, the ejector inlets remain active after the drying even if the substrate is not removed immediately from the spin dispenser module to avoid unwanted deposition of organic material.

FIGS. 2A and 2B are top views of a dispenser arm over a substrate with different ejector inlet configurations in accordance with various embodiments of the present disclosure. In FIG. 2A, a dispenser arm 201 with a dispenser 203 at one end of the arm is disposed over a substrate 205. The dispenser 203 projects towards the substrate 205. Ejector lines 207 are attached to the dispenser arm 201 with ejector inlets at the end of the ejector lines 207. The ejector inlets are also projected toward the substrate 205. In some embodiments, the ejector lines 207 include traversing portions shown in dotted lines. The traversing portions also include ejector inlets so that the ejector inlets may be present around the dispenser not only on two sides, but also on three or four sides. FIG. 3A shows a side view of the dispenser arm and substrate of FIG. 2A. The ejector lines 207 runs along the sides of the dispenser and terminates at ejector inlets 211.

In FIG. 2B, the ejector lines 208 have a different configuration from the ejector lines 207 of FIG. 2A. The ends of the ejector lines 208 project away from the dispenser 203 and toward the substrate 205. FIGS. 3B and 3C are side views of the dispenser arm and substrate of FIG. 2B in different configurations. In FIG. 3B, the ejector lines 208 point at the substrate 205 at an angle. The ejector inlets 213 are located away from the dispenser 203. In FIG. 3C, the ejector lines 208 extend away from the dispenser 203 and point down at the substrate 205 while remaining parallel to the dispenser 203. The ejector inlets 215 are also located away from the dispenser 203.

Various embodiments of the ejector lines and ejector inlets are possible. As discussed, more than two, for example, four or more ejector inlets may be used. The ejector inlets may be placed all around the dispenser. The ejector inlet may have a shape different from a cross section of the ejector line. For example, the ejector inlet may flare out or come to a smaller cross section, depending on a desired pressure drop. The ejector inlets may be located in more than one vertical location, for example, some ejector inlets may be further away from the substrate than others. In some embodiments, a portion of the ejector line may be perforated so as to create additional ejector inlets. Generally, the ejector inlets and ejector lines are designed to not have a very strong flow that would affect the surface of the substrate. In other words, the flow in the volume proximate to the substrate surface should not change significantly whether the ejector is on or off.

Figure 4C:
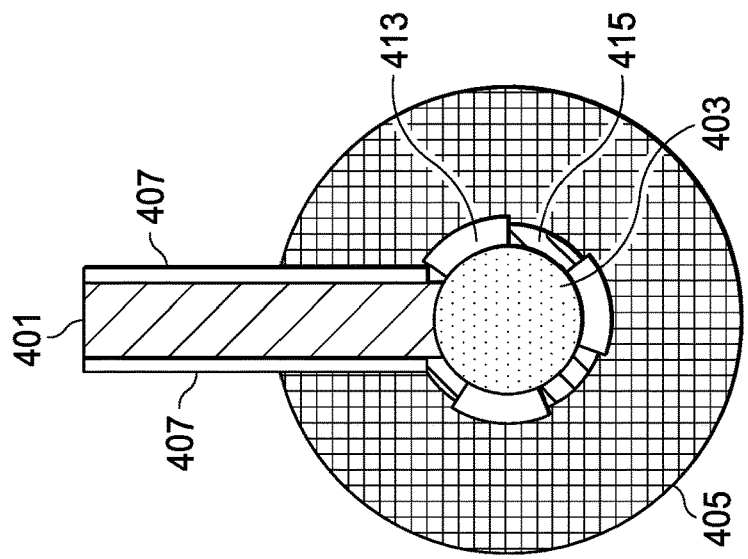
FIGS. 4A to 4C are top views of a dispenser arm and dispenser over a substrate according to various embodiments.
Figure 4B:
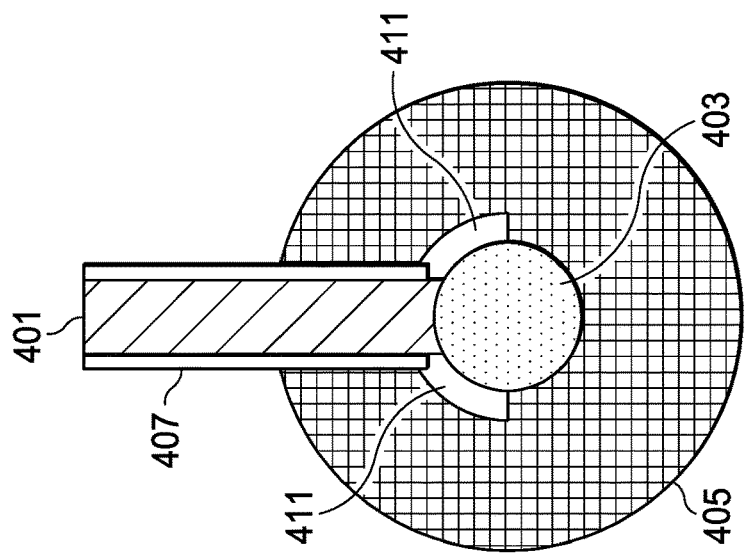
Figure 4A:
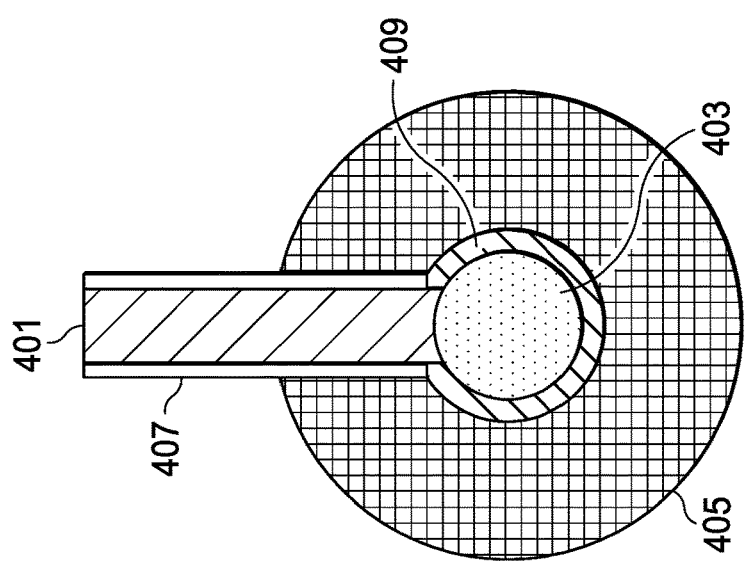

In some embodiments, the dispenser may have a shape other than those in FIGS. 2A/2B and 3A/3B/3C. For example, the dispenser may have a cylindrical shape as shown in FIGS. 4A to 4C. FIGS. 4A to 4C are top views of a dispenser arm over a substrate with different ejector inlet configurations in accordance with various embodiments of the present disclosure. In FIG. 4A, a dispenser arm 401 with a dispenser 403 at one end of the arm is disposed over a substrate 405. The dispenser 403 projects towards the substrate 405. Ejector lines 407 are attached to the dispenser arm 401 with ejector inlets 409 in a ring shape. The ejector lines 407 extend toward the substrate 405 as a cylindrical ring with one or more ejector inlets at a bottom of the cylindrical ring. In some embodiments, the entire bottom of the cylindrical ring portion of the ejection line 407 is open and acts as one ejector inlet. In other embodiments, portions of the bottom of the cylindrical ring include two or more ejector inlet openings. In some embodiments, a sidewall portion of the cylindrical ring includes openings that act as ejector inlets.

In FIG. 4B, a dispenser arm 401 with a dispenser 403 at one end of the arm is disposed over a substrate 405. The dispenser 403 projects towards the substrate 405. Ejector lines 407 are attached to the dispenser arm 401. Around the dispenser 403, the ejector lines 407 extend toward the substrate 405 in two segments 411 around the dispenser 403. At the bottom of the ejector lines 407 are the ejector inlets. The ejector inlets opening may have a shape of the segments 411. For example, the entire bottom portion of the segments 411 may be open to the volume over the substrate 405 and acts as ejector inlets. In some embodiments, the bottom of the segments 411 may have one or more openings acting as the ejector inlets. Some embodiments may further include openings on a sidewall of the segments 411.

In FIG. 4C, yet another embodiment of the ejector lines 407 and ejector inlets is disclosed. Similar to FIG. 4A, the ejector lines 407 extends toward the substrate 405 in a cylindrical ring shape. However, the openings 413 at the bottom of the cylindrical ring projects out. The ejector inlet openings 413 are wider than the cylindrical ring 415. The outward projection of the openings may be similar to FIG. 3B where a bottom portion is angled relative to the dispenser. The outward projection of the openings may also be similar to FIG. 3C where the ejector line makes a turn.

In the various embodiments discussed in association with FIGS. 2A-2B, 3A-3C, and 4A-4C, the ejector lines are attached or mounted to a dispenser arm and dispenser. However, other embodiments where the ejector lines are independent from the dispenser arm and dispenser are also envisioned. Thus, the inventive concepts of this disclosure are not limited to embodiments where the ejector lines are attached to the dispenser arm.

Figure 5:
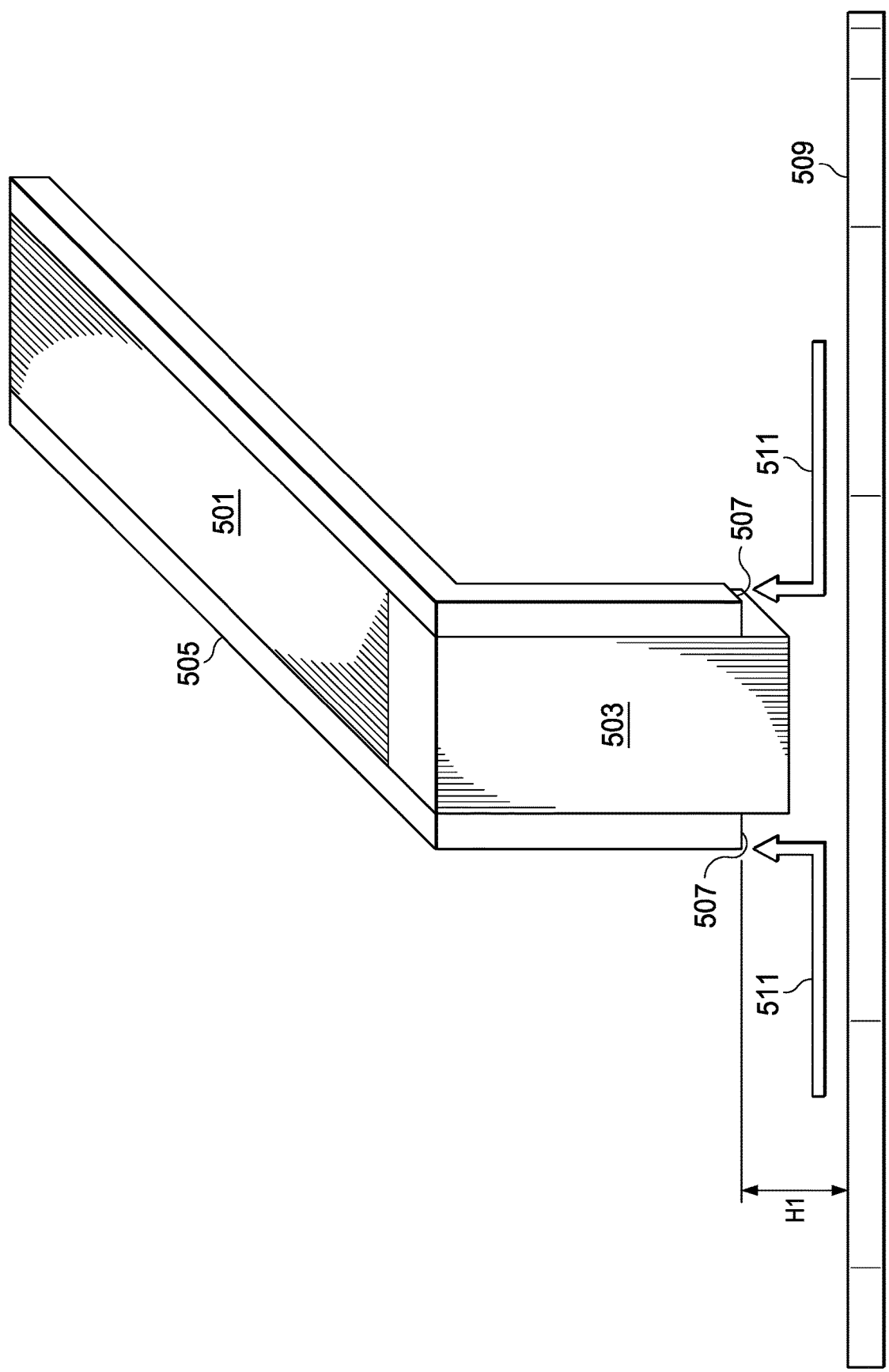
FIG. 5 is a plan view of dispenser and ejector over a substrate in accordance with various embodiments of the present disclosure.

FIG. 5 is a perspective view of a dispenser arm 501, a dispenser 503, and ejector line 505 along the dispenser arm 501 and sides of the dispenser 503, terminating in ejector inlets 507. The distance of the opening of the ejector inlets 507 from a substrate 509 when the ejector is in operation is defined as H1. H1 depends partially on the chamber pressure, the amount of negative pressure applied by the ejector, and properties of the film on the substrate 509. When H1 is small, the amount of negative pressure is also small to avoid a flow causing a pattern to form on the film on the substrate 509. On the other hand, if a large negative pressure is applied, then H2 should be larger to avoid inadvertently patterning the substrate. As discussed, during the spin dispenser module operation, the film formed on the substrate 509 should be uniform. According to various embodiments, H1 may be between about 5 mm to about 50 mm from a top of the substrate. In some embodiments, H1 is about 20 mm or about 30 mm. Arrows 511 shows direction of flow of gas and particulates around the vicinity of the ejector inlets 507.

Figure 6:
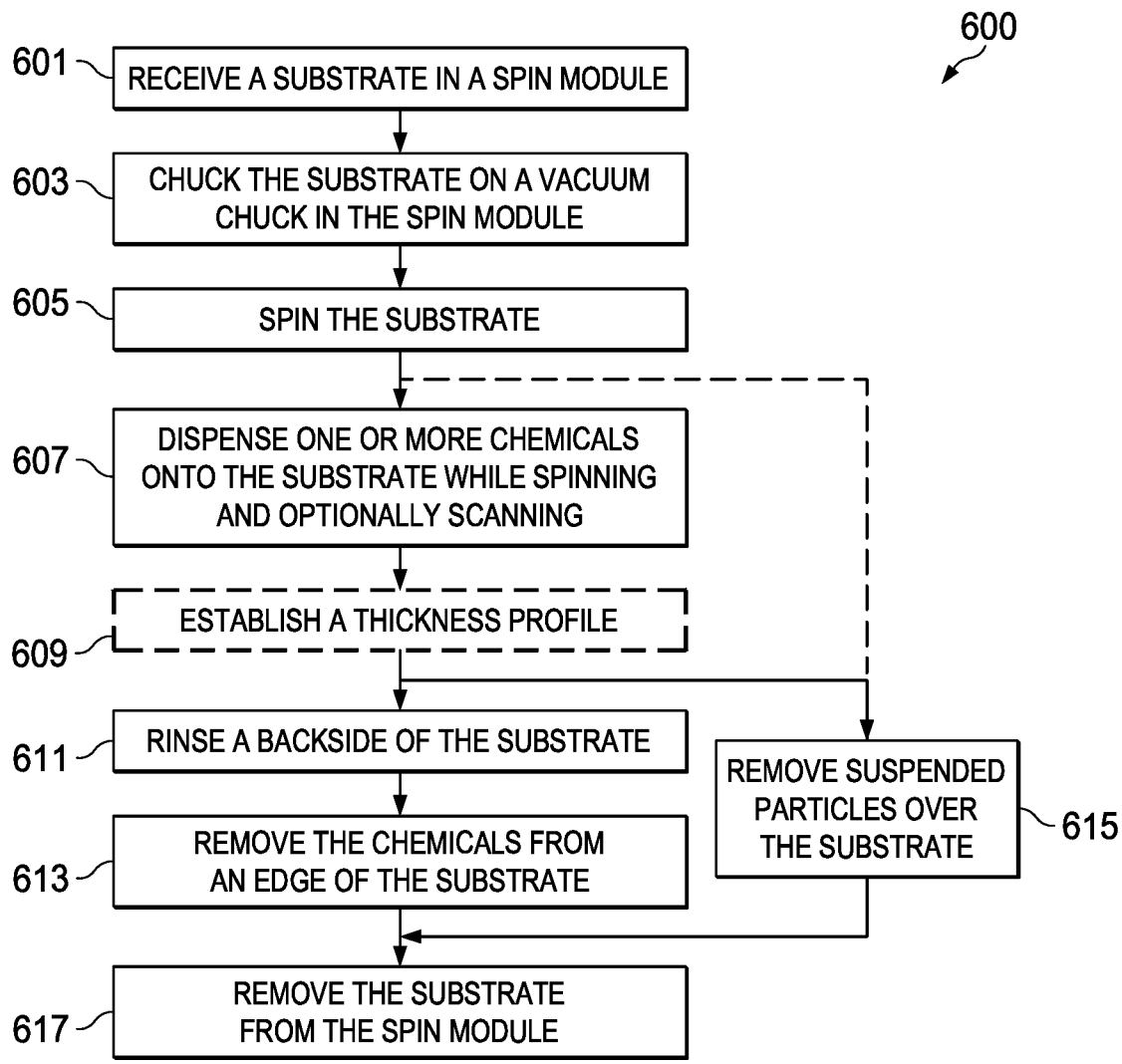
FIG. 6 is a process flow chart for various methods of using a spin dispenser module in accordance with various embodiments of the present disclosure.

FIG. 6 is a process flow chart of a process 600 using the spin dispenser module of the present disclosure. In operation 601, a substrate is received in the spin dispenser module. The substrate enters a semiconductor processing tool having the spin dispenser module through a loadlock. A robot arm transfers the substrate from the loadlock to the spin dispenser module. The substrate may be centered and lowered onto a rotatable platform by a number of pins in the rotatable platform.

In operation 603, the substrate is chucked on a vacuum chuck in the spin dispenser module. The vacuum chuck is a part of the rotatable platform and secures the substrate to the rotatable platform during processing. In operation 605, the substrate is spun. The substrate may be spun at a first speed and then a second speed to ensure centering and to allow the chamber pressure to reach a stable level. One or more exhaust ports around the cup are utilized to stabilize the pressure and evacuate the chamber.

In operation 607, one or more chemicals are dispensed onto the substrate while the substrate is spinning and optionally the dispensing is performed in a scanning motion by moving a dispenser arm along a track. For photoresist coating, the one or more chemicals may include a solvent and then the photoresist material. A solvent may be an adhesive that ensures the coating of the photoresist material. In one embodiment, the solvent is hexamethyldisilazane (HDMS). During and after the first solvent is applied, the rotation speed may be changed to ensure adequate coating and removal of excess solvent from the substrate to the cup exhaust. For example, the substrate may be spun at a lower speed when the solvent is first dispensed and the speed increased at the end of the dispensing period. The solvent may be given some time to react with the surface before the photoresist material is applied. After the photoresist material is applied, the rotational speed of the substrate may again increase to evenly coat the substrate with the photoresist material and to ensure removal of excess material to the cup exhaust. In some embodiments, the photoresist material is allowed to dry slightly to establish a thickness profile, as shown in operation 609. In some embodiments, the thickness is checked by an in-situ monitor. Additionally, a uniformity of the coating may be checked by an in-situ monitor.

In the photoresist coating embodiments, after the thickness profile is established, a backside of the substrate is rinsed in operation 611. Excess coating material on the backside of a substrate may become particle contaminants in a subsequent process and is removed completely by rinsing with a solvent. A nozzle in the cup below the substrate sprays a solvent at the backside of the substrate as it spins. The rinse is removed by the exhaust of the cup.

In operation 613, an edge of the chemical coated onto the substrate is removed. In the edge removal operation, a thin stream of solvent is aimed directly at a substrate edge and removes the coating material as the substrate spins. The edge removal operation is also referred to as the "edge bevel removal" or sometimes "edge bead removal." Removing the coating material from the edge allows the substrate to be processed and handled in subsequent manufacturing steps without any coating at the edge flaking off and potentially becoming contaminants.

In various embodiments, operations 611 and 613 may be performed separately, concurrently, or partially concurrently. In one embodiment, the backside rinse is performed for some time before the edge removal starts. Both operations proceed for a time before the backside rinse stops while the edge removal continues.

In operation 615, suspended particles over the substrate are removed. The suspended particles are gaseous and particulate organic material and any other material in a chamber volume over the substrate. A negative pressure is applied through ejector inlets over the substrate to suction out these particles. In some embodiments, the ejector inlets may sweep across, or scan, the substrate surface during this operation. In some embodiments, the ejector inlets are stationary, for example, over a middle or center portion of the substrate. Removal of the suspended particles prevents these particles from depositing on the surface of the substrate and becoming a source for defects in subsequent processes.

When the ejector inlets are attached to the dispenser, the operation of the ejector does not coincide with operation of the dispenser. In other words, in the illustrated embodiments, no dispensing is occurring during ejector suction. Thus scanning the ejector inlets does not affect scanning for dispensing. Other embodiments, however, wherein dispensing and ejector suction may occur simultaneously, are within the contemplated scope of the present disclosure.

The operation 615 may be performed concurrently with operations 611 and 613 while the backside rinsing and the edge bevel removal is occurring. The operation 615 may also be performed before and after operations 611 and 613 before the substrate is removed from the spin dispenser module in operation 617. Depending on the process times, a semiconductor tool may include two or more spin dispenser modules that are serviced by one robot arm and may be routed through the same load lock. Thus in some cases, a substrate may stay in the spin dispenser module for some time before it exits. During this waiting time, the ejector inlets may continue to operate and prevent undesirable deposition of suspended particles on the substrate. After the substrate exits the photoresist coating spin dispenser module, it may be baked to harden the photoresist material.

The method 600 of FIG. 6 also applies to spin dispenser modules that dispense material other than photoresist. For example, the dispensed material may be a developer. The developer may be dispensed in a scanning motion by the dispenser and allowed to react with the exposed photoresist coating while the substrate spins. A portion of the photoresist coating is dissolved during the developing process and rinsed away from the substrate surface. The developing process may also include backside rinsing and edge bevel removal.

By comparing defect performance for substrates that are removed from the spin dispenser module immediately and those that had a wait time before being removed from the spin dispenser module, it is believed that the use of ejector can reduce defects by about 75% or more. Reduction of total organic compound (TOC) in the chamber volume over the substrate after coating reduces the likelihood of unwanted deposition of organic material. In one example, average defect count is reduced from about 25 defects per test area to about 5 defects per test area. In another example, average defect count is reduced from about 70 defects to about 20 defects per test area.

One embodiment is a method, including placing a substrate into a spin dispenser module on a rotatable platform in a cup. The substrate is chucked on the rotatable platform. The rotatable platform is rotated. A liquid coating material is dispensed onto the substrate. A vacuum source connected to one or more ejector inlets is controlled to remove particles over the substrate through the one or more ejector inlets without altering the liquid coating material on the substrate. A backside of the substrate is rinsed. The liquid coating material is removed from an edge of the substrate. The substrate is removed from the spin dispenser module.

Another embodiment is a method, including dispensing a liquid developer onto a wafer disposed in a spin dispenser module on a rotatable platform in a cup, causing the liquid developer to be disposed on the wafer and particles to be suspended over the wafer. The particles over the wafer are removed through one or more ejector inlets. A backside of the wafer is rinsed. The wafer is removed from the spin dispenser module.

Another embodiment is a method, including dispensing a liquid coating onto a substrate disposed on a platform in a spin dispensing module, the liquid coating being dispensed from a liquid dispensing nozzle positioned above the substrate while rotating the substrate, where dispensing the liquid coating causes gaseous materials to be suspended above the liquid coating. After dispensing the liquid coating onto the substrate, the gaseous materials suspended above the substrate are at least partially removed through one or more ejector inlets, where the one or more ejector inlets are positioned further from the substrate than the liquid dispensing nozzle. The substrate is then removed from the spin dispensing module.

In one aspect, the present invention described a spin dispenser module. The spin dispenser module includes a cup having a basin with sidewalls and an exhaust, a rotatable platform situated inside the cup adapted for holding and rotating a substrate, a liquid dispenser disposed over the rotatable platform for dispensing a liquid coating material on top of the substrate, one or more ejector inlets disposed over the rotatable platform, the one or more ejectors connected to a negative pressure source, and a motor coupled to the rotatable platform to rate the rotatable platform at different rotational speeds.

In another aspect, the present invention pertains to methods of using a spin dispenser module. The method includes placing a substrate into a spin dispenser module on a rotatable platform in a cup, chucking the substrate on the rotatable platform, rotating the rotatable platform, dispensing a liquid coating material onto the substrate, removing particles over the substrate through one or more ejector inlets, rinsing a backside of the substrate, removing the liquid coating material from an edge of the substrate, and removing the substrate from the spin dispenser module.

In the preceding detailed description, the present invention is described with reference to specific exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method, comprising:
    placing a substrate into a spin dispenser module on a rotatable platform in a cup;
    chucking the substrate on the rotatable platform;
    rotating the rotatable platform;
    dispensing a liquid coating onto the substrate via a dispensing nozzle;
    controlling a vacuum source connected to one or more ejector inlets disposed over at least a center of the substrate, the one or more ejector inlets disposed further from the substrate than the dispensing nozzle, removing particles suspended in a gaseous volume over the substrate through the one or more ejector inlets without affecting a drying time of the liquid coating on the substrate;
    rinsing a backside of the substrate;
    removing the liquid coating from an edge of the substrate; and
    removing the substrate from the spin dispenser module.

2. The method of claim 1, wherein removing particles over the substrate through one or more ejector inlets is performed during rinsing a backside and removing the liquid coating from an edge of the substrate.

3. The method of claim 1, wherein removing particles over the substrate through one or more ejector inlets is performed while scanning the one or more ejector inlets across the substrate.

4. The method of claim 1, wherein removing particles over the substrate through one or more ejector inlets includes varying a relative height of the one or more ejector inlets from the substrate.

5. The method of claim 1, wherein removing particles over the substrate through one or more ejector inlets includes varying a rotation speed of the rotatable platform.

6. The method of claim 1, wherein removing particles over the substrate through one or more ejector inlets includes varying a suction pressure of the one or more ejector inlets.

7. The method of claim 1, wherein removing particles over the substrate through one or more ejector inlets is performed until the substrate is removed from the spin dispenser module.

8. The method of claim 1, wherein removing particles over the substrate through one or more ejector inlets is performed for at least 20% of a duration of the method.

9. The method of claim 1, wherein the particles are organic compounds.

10. A method, comprising:
dispensing a liquid developer from a liquid dispensing nozzle onto a wafer disposed in a spin dispenser module on a rotatable platform in a cup, causing the liquid developer to be disposed on the wafer and particles to be suspended over the wafer;
performing a rinsing, the rinsing removing a developed portion of a photoresist and the liquid developer from the wafer;
while dispensing the liquid developer and while performing the rinsing, removing the particles over the wafer through one or more ejector inlets, the one or more ejector inlets being disposed a distance from the wafer which is further than the liquid dispensing nozzle;
rinsing a backside of the wafer; and
removing the wafer from the spin dispenser module.

11. The method of claim 10, wherein removing the particles over the wafer comprises vacuuming the particles through the one or more ejector inlets while moving the ejector inlets laterally above the wafer.

12. The method of claim 11, wherein removing the particles over the wafer does not alter the liquid developer disposed on the wafer.

13. The method of claim 10, wherein dispensing the liquid developer comprises providing the liquid developer to the wafer from a liquid dispensing nozzle, and wherein removing the particles over the wafer comprises controlling a vacuum source coupled to the one or more ejector inlets, wherein the one or more ejector inlets are disposed proximate to the liquid dispensing nozzle and configured to move concurrently with the liquid dispensing nozzle.

14. The method of claim 10, further comprising routing the particles to a chemical exhaust via ejector lines coupled to the ejector inlets.

15. The method of claim 10, further comprising:
cleaning the liquid developer from an edge of the wafer while rinsing the backside of the wafer.

16. A method, comprising:
dispensing a liquid coating onto a substrate disposed on a platform in a spin dispensing module, the liquid coating being dispensed from a liquid dispensing nozzle positioned above the substrate while rotating the substrate, wherein dispensing the liquid coating causes gaseous materials to be suspended above the liquid coating;
after dispensing the liquid coating onto the substrate, at least partially removing the gaseous materials suspended above the substrate through one or more ejector inlets, the one or more ejector inlets positioned further from the substrate than the liquid dispensing nozzle, the one or more ejector inlets being attached to the liquid dispensing nozzle, wherein removing the gaseous materials suspended above the substrate does not create a pattern in a surface of the liquid coating; and
removing the substrate from the spin dispensing module.

17. The method of claim 16, wherein while removing the gaseous materials, rotating the substrate.

18. The method of claim 17, wherein while removing the gaseous materials, sweeping the one or more ejector inlets above the substrate.

19. The method of claim 16, wherein removing the gaseous materials comprises controlling a vacuum source coupled to the ejector inlets without altering the liquid coating.

20. The method of claim 1, wherein removing the particles suspended in a gaseous volume over the substrate through the one or more ejector inlets is further performed without forming a pattern in the liquid coating on the substrate.

* * * * *